(12) United States Patent
Huli et al.

(10) Patent No.: US 12,216,400 B2
(45) Date of Patent: Feb. 4, 2025

(54) DIRECTED SELF-ASSEMBLY

(71) Applicant: Tokyo Electron Limited, Tokyo (JP)

(72) Inventors: Lior Huli, Albany, NY (US); Richard Farrell, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 937 days.

(21) Appl. No.: 17/155,931

(22) Filed: Jan. 22, 2021

(65) Prior Publication Data
US 2022/0236639 A1    Jul. 28, 2022

(51) Int. Cl.
| G03F 7/00 | (2006.01) |
| B81C 1/00 | (2006.01) |
| C08L 25/06 | (2006.01) |
| C08L 53/00 | (2006.01) |
| C09D 153/00 | (2006.01) |
| B82Y 40/00 | (2011.01) |

(52) U.S. Cl.
CPC ........ *G03F 7/0002* (2013.01); *B81C 1/00031* (2013.01); *C08L 25/06* (2013.01); *C08L 53/00* (2013.01); *C09D 153/00* (2013.01); *B81C 2201/0149* (2013.01); *B82Y 40/00* (2013.01)

(58) Field of Classification Search
CPC .............................. G03F 7/0002; B05D 1/005
See application file for complete search history.

(56) References Cited

U.S. PATENT DOCUMENTS

| 8,450,418 | B2 * | 5/2013 | Millward | C08F 8/00 |
| | | | | 525/203 |
| 8,900,467 | B1 | 12/2014 | Chapuis et al. | |
| 8,945,408 | B2 * | 2/2015 | Chakrapani | B81C 1/00031 |
| | | | | 216/49 |
| 9,299,381 | B2 * | 3/2016 | Nealey | B82Y 40/00 |
| 9,412,611 | B2 | 8/2016 | Somervell et al. | |
| 9,416,447 | B2 | 8/2016 | Arora et al. | |
| 9,557,639 | B2 * | 1/2017 | Kim | G03F 7/0002 |
| 9,663,682 | B2 * | 5/2017 | Zhang | C09D 183/10 |
| 9,718,082 | B2 | 8/2017 | deVilliers et al. | |

(Continued)

OTHER PUBLICATIONS

R.A. Lawson, A.J. Peters, P.J. Luovice, C.L. Henderson, Tuning Domain Size of Block Copolymers for Directed Self Assembly Using Polymer Blending: Molecular Dynamics Simulation Studies, Proc. of SPIE 8680, Alternative Lithographic Technologies V, 86801Z (Apr. 5, 2013). (Year: 2013).*

(Continued)

*Primary Examiner* — William P Fletcher, III
(74) *Attorney, Agent, or Firm* — Slater Matsil, LLP

(57) ABSTRACT

A method for forming a device includes blending, in a mixer within a fabrication facility, a first liquid including a first block copolymer with a second liquid including a second block copolymer to form a first mixture. The first block copolymer includes a first homopolymer and a second homopolymer, where the first homopolymer has a first mole fraction in the first liquid. The second block copolymer includes the first homopolymer and the second homopolymer, the first homopolymer having a second mole fraction in the second liquid, the first mole fraction being different from the second mole fraction. The method includes placing a substrate over a substrate holder of a processing chamber within the fabrication facility; and coating the substrate with the first mixture within the processing chamber.

20 Claims, 7 Drawing Sheets

(56) References Cited

U.S. PATENT DOCUMENTS

| | | | |
|---|---|---|---|
| 9,735,023 B2* | 8/2017 | Zhang | C09D 183/10 |
| 9,828,518 B2* | 11/2017 | Hustad | C09D 153/00 |
| 10,011,713 B2* | 7/2018 | Hustad | C08L 53/00 |
| 10,287,455 B2* | 5/2019 | Zhang | C08F 220/14 |
| 10,403,501 B2 | 9/2019 | deVilliers et al. | |
| 10,495,615 B2* | 12/2019 | Suh | C08F 297/026 |
| 10,712,663 B2 | 7/2020 | deVilliers et al. | |
| 11,021,630 B2* | 6/2021 | Hustad | C09D 153/00 |
| 11,342,427 B2* | 5/2022 | deVilliers | H01L 29/401 |
| 2006/0134556 A1* | 6/2006 | Nealey | G03F 7/265 |
| | | | 430/311 |
| 2009/0196488 A1* | 8/2009 | Nealey | G11B 5/743 |
| | | | 382/145 |
| 2012/0164392 A1 | 6/2012 | Stoykovich et al. | |
| 2013/0209344 A1* | 8/2013 | Chang | C09D 151/08 |
| | | | 423/325 |
| 2013/0209755 A1* | 8/2013 | Hustad | G03F 7/0002 |
| | | | 216/49 |
| 2014/0291878 A1* | 10/2014 | Somervell | B29C 59/08 |
| | | | 264/40.1 |
| 2014/0377965 A1 | 12/2014 | Schmid et al. | |
| 2016/0186004 A1 | 6/2016 | Hustad et al. | |
| 2020/0057368 A1* | 2/2020 | Chevalier | G03F 7/168 |
| 2020/0338510 A1 | 10/2020 | Nasman et al. | |

OTHER PUBLICATIONS

"Facility, N., Sense 6.c." Oxford English Dictionary, Oxford UP, Sep. 2024, https://doi.org/10.1093/OED/8921873702. (Year: 2024).*

Lawson, Richard A., et al., "Tuning domain size of block copolymers for directed self assembly using polymer blending: molecular dynamics simulation studies," Proc. SPIE 8680, Alternative Lithographic Technologies V, 86801Z (Apr. 5, 2013); doi: 10.1117/12.2021442.

Barros, Patricia Pimenta et al., "DSA planarization approach to solve pattern density issue", ResearchGate, https://www.researchgate.net/publication/281952107, Mar. 2015, 11 pages.

International Preliminary Report on Patentability (Chapter I), PCT Application No. PCT/US2022/012198; Aug. 3, 2023, 7 pages.

International Search Report and Written Opinion, PCT Application No. PCT/US2022/012198; May 2, 2022, 10 pages.

* cited by examiner

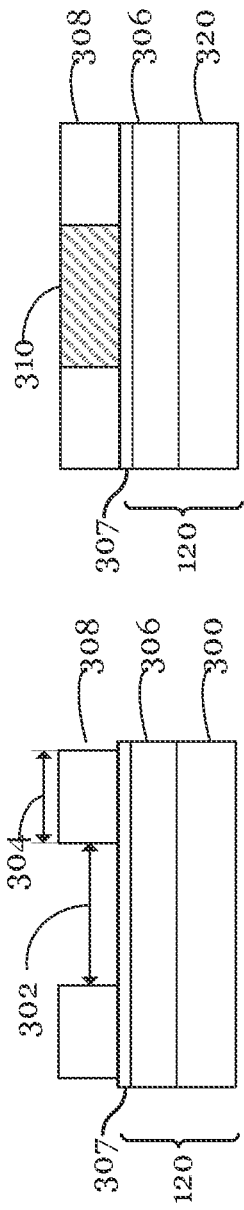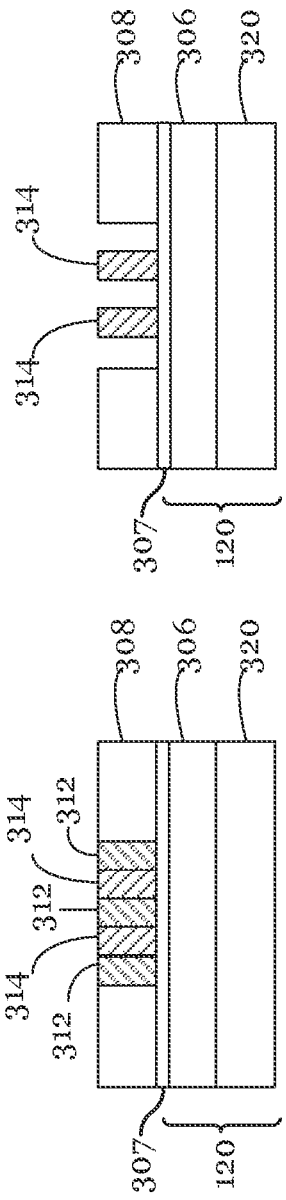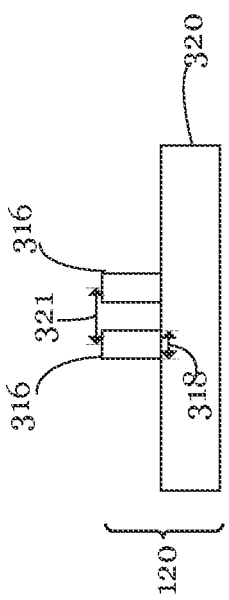

//DIRECTED SELF-ASSEMBLY

TECHNICAL FIELD

The present invention relates generally to semiconductor processing, and, in particular embodiments, to systems, tools, and methods for directed self-assembly.

BACKGROUND

Generally, the fabrication of Integrated Circuits (IC's) requires the formation of numerous device elements onto a semiconductor substrate. Traditionally, IC's are fabricated using optical lithography. Optical lithography forms device elements by forming a layer of photoresist on a substrate, partially exposing the photoresist to light through a patterned mask, developing the exposed photoresist to define the mask pattern in the photoresist, and then etching the photoresist to form the pattern in substrate.

Semiconductor technology is driven by a demand for doubling circuit density every two years. As circuit density increases, critical dimensions and pitches of IC device elements decrease. Critical dimensions and pitches have decreased in size to a point at which optical lithography based processes are using multiple patterning techniques to achieve the needed critical dimensions, which increases the costs of the fabrication process. In addition, future technology nodes may require even more complicated multiple patterning steps.

Directed self-assembly (DSA) has been identified as an alternative method to form more densely packed devices. The DSA process is controlled by the molecular weight of the block copolymer mixture, which in theory, can be set to the desired dimension, which may be smaller than the dimensions achievable with optical lithography.

This is because directed self-assembly allows forming small device elements using self-assembling block copolymers along with a guide pattern formed using a lithography process. However, the guide pattern is patterned using a coarser lithography process while the subsequent directed self-assembly process has the potential to form features having critical dimensions comparable to that achieved with a multiple patterning process.

However, directed self-assembly has its own advantages and disadvantages. As noted above, feature size in a directed self-assembly process is determined by the mixture of the block copolymers used. More specifically, in a typical directed self-assembly process, the molecular weight of the block copolymer mixture controls the critical dimension, pitch, and phase (shape) of the formed device elements. A single block copolymer mixture can only correspond to a single critical dimension, pitch, and shape. While this attribute can be leveraged to develop features that may not be easily formed with lithography, the DSA process brings its own unique set of challenges.

SUMMARY

In accordance with an embodiment of the present invention, a method for forming a device includes blending, in a mixer within a fabrication facility, a first liquid including a first block copolymer with a second liquid including a second block copolymer to form a first mixture, the first block copolymer including a first homopolymer and a second homopolymer, the first homopolymer having a first mole fraction in the first liquid, the second block copolymer including the first homopolymer and the second homopolymer, the first homopolymer having a second mole fraction in the second liquid, the first mole fraction being different from the second mole fraction; placing a substrate over a substrate holder of a processing chamber within the fabrication facility; and coating the substrate with the first mixture within the processing chamber.

In accordance with an embodiment of the present invention, a method for forming a device includes blending, in a mixer within a fabrication facility, a first block copolymer and a solvent to form a first mixture, the first block copolymer including a first homopolymer and a second homopolymer; placing a substrate over a substrate holder of a processing chamber within the fabrication facility; and coating the substrate with the first mixture within the processing chamber.

In accordance with an embodiment of the present invention, a method for forming a device includes blending, in a mixer within a fabrication facility, a first liquid including a first block copolymer and a second liquid including essentially a first homopolymer to form a first mixture, the first block copolymer including the first homopolymer and a second homopolymer; placing a substrate over a substrate holder of a processing chamber within the fabrication facility; and coating the substrate with the first mixture within the processing chamber.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3A-3E illustrates cross-sectional views of a semiconductor device during various stages of fabrication in accordance with an embodiment of the present application, wherein FIG. 3A illustrates the device after forming a patterned photoresist layer, FIG. 3B illustrates the device after coating a mixture comprising a blended block copolymer, FIG. 3C illustrates the device after annealing, FIG. 3D illustrates the device after selectively removing a plurality of regions, and FIG. 3E illustrates the device after forming a first pattern of device elements;

FIGS. 6A-6B illustrates cross-sectional views of a semiconductor device during various stages of fabrication in accordance with an embodiment of the present application, wherein FIG. 6A illustrates the device after coating a second patterned photoresist layer with a second block copolymer mixture, and FIG. 6B illustrates the device after forming a second patterned layer of device elements.

Corresponding numerals and symbols in the different figures generally refer to corresponding parts unless other-

DETAILED DESCRIPTION OF ILLUSTRATIVE EMBODIMENTS

Figure 1:
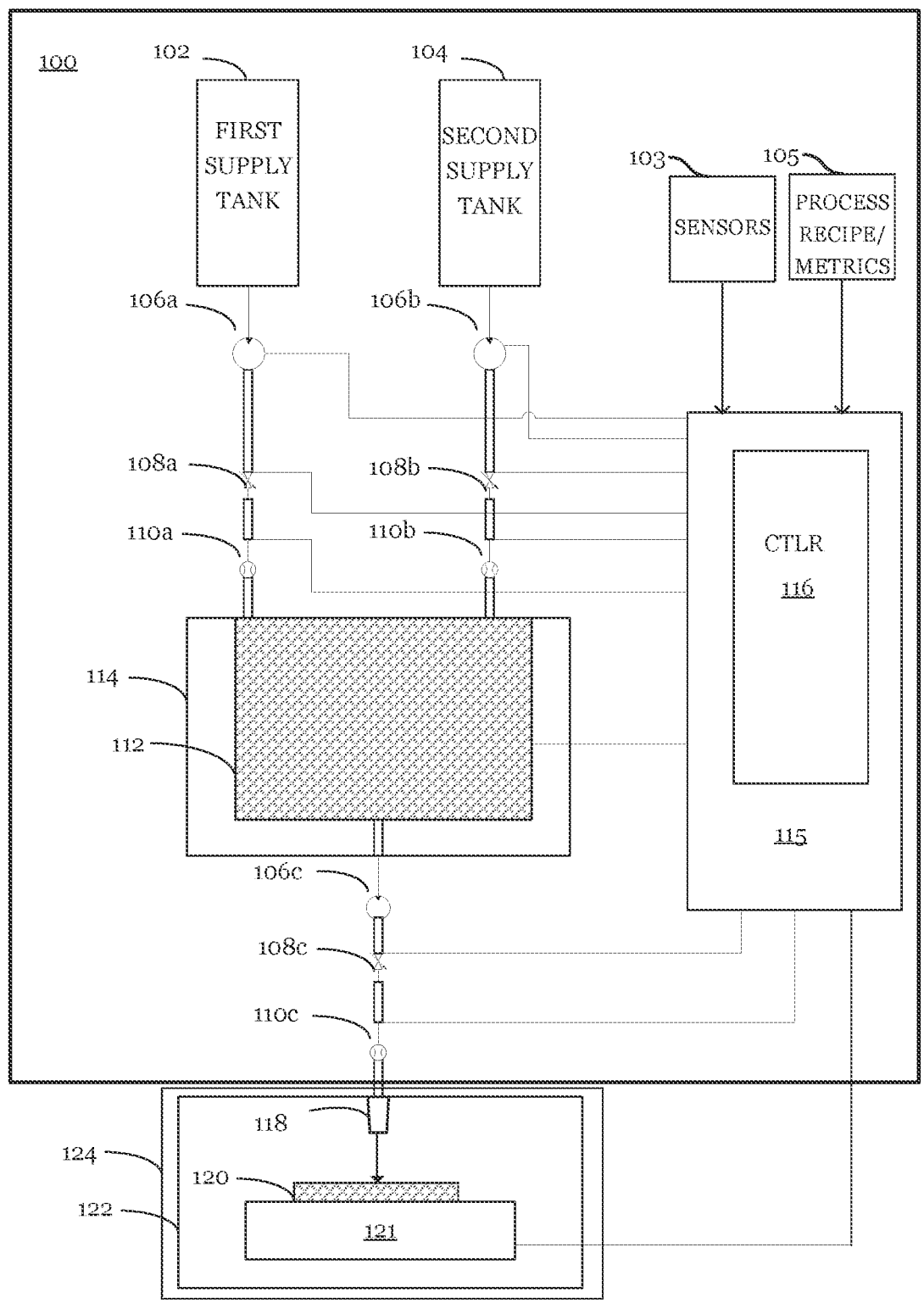
FIG. 1 illustrates a block copolymer coating tool in accordance with an embodiment of the present application.

As previously noted, a directed self-assembly process uses block copolymers. Block copolymer mixtures are blended by vendors and shipped pre-packaged to the manufacturing facility in discrete bottles. A disadvantage of such a typical directed self-assembly process is that vendors of pre-packaged block copolymers are generally not aware of the specific process requirements for a given process flow and therefore would not be able to meet the specific composition process window required at the manufacturing facility, e.g., to meet the critical dimension targets for the features. A high volume manufacture of IC's may require multiple packages of the same block copolymer mixture. However, due to quality control issues, multiple bottles of the same block copolymer mixture, especially from different batches, may have inconsistent molecular weights. Hence, different packages of the same block copolymer mixture from the vendor may have differing compositions of the block copolymers and therefore produce features having different critical dimensions and pitches. As an example, in some technologies, a 10% batch-to-batch variability of the molecular weight of a block copolymer mixture can change the critical dimension of a device element by more than 6%. Such large deviations can potentially cause a process hold, where the production line is stopped until the feature sizes are brought back within the process window. Also, reordering pre-packaged block copolymer mixtures is costly because of the downtime of the fabrication facility for the time taken to receive the new bottle.

Another disadvantage of directed self-assembly is that every feature having a different critical dimension uses a separate block copolymer mixture. This is costly and time consuming if multiple levels or features are to be fabricated with a directed self-assembly process in a traditional semiconductor fabrication process. This is because for each feature that has to be patterned at a different feature size, a different composition of the block copolymer is to be used, which has to be delivered to the manufacturing facility. This can cause a significant bottleneck and increase costs associated with managing multiple bottles of pre-packaged block copolymer mixtures. For example, using multiple prepackaged bottles can get expensive due to the complexities associated with purchasing, scheduling, storing, and tool requirements associated with using different bottles.

Another disadvantage of directed self-assembly is that a pre-packaged block copolymer mixture has a single film thickness which can result in an uneven fill pattern across the substrate when the mixture is applied. In other words, each pre-packaged block copolymer mixture has a predetermined film thickness that it is able to achieve. Therefore, if a pre-packaged block copolymer mixture has a film thickness less than a target thickness, a pattern of device elements will not be properly filled. Thus, even for features having the same critical dimension, the same bottles may not be used because of the differences in thickness of the base layer being patterned.

Embodiments of the present invention advantageously avoid the above issues by forming the block copolymer mixtures within the fabrication facility which allows for consistency between batches, improved control over the feature metrics such as critical dimension, pitch, microphase separation, surface roughness, local critical dimension uniformity, and control of the pattern fill density to ensure a uniform coating across a substrate. This disclosure describes embodiments of methods of blending block copolymer mixtures in an inline mixer within a processing tool such as a coating tool within a fabrication facility that enables cost effective manufacturing of ICs with a directed self-assembly process.

Figure 2:
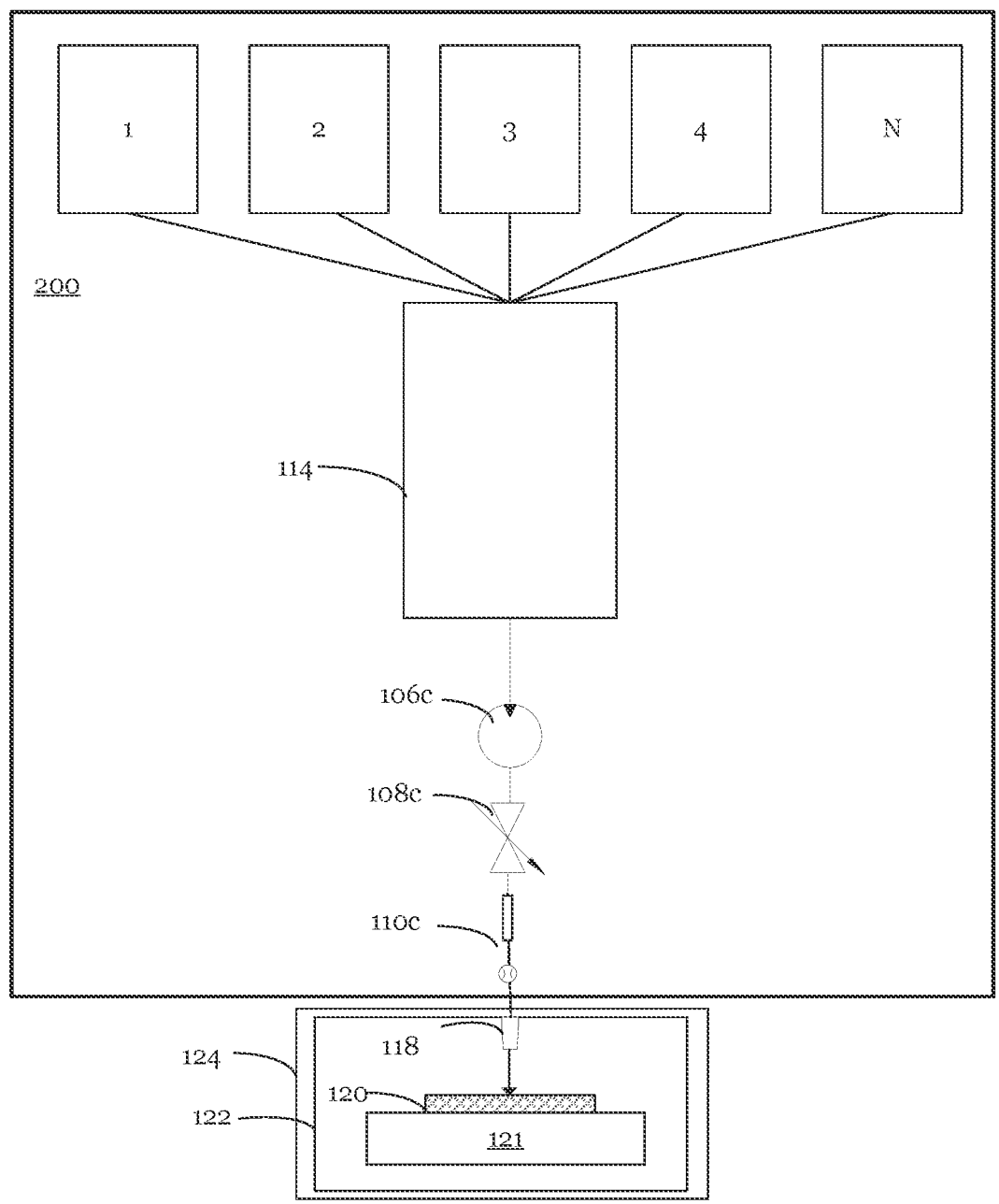
FIG. 2 is illustrates a block copolymer coating tool in accordance with an embodiment of the present application.

A coating tool within a fabrication facility is illustrated in FIG. 1 and FIG. 2, in accordance with an embodiment of the invention. Several example embodiments of methods of forming a semiconductor device with the coating tools are described in greater detail in FIGS. 3-7.

FIG. 1 illustrates a block copolymer coating tool in accordance with an embodiment of the present application.

As illustrated in FIG. 1, the block copolymer coating tool includes a first mixer apparatus 100 and a processing tool 124 in which a semiconductor substrate 120 is processed. The processing tool 124 comprises a processing chamber 122 and a substrate holder 121 configured to support the semiconductor substrate 120 during processing. A blended block copolymer mixture is coated onto a major surface of the semiconductor substrate 120 by injecting the blended block copolymer mixture from the first mixer apparatus 100 through a nozzle 118 of the processing tool 124. For example, the nozzle 118 may be a flat flan nozzle, solid stream nozzle, or any other nozzle known to a person having ordinary skill in the art.

The substrate holder 121 may be configured to be rotated during the coating process. The processing chamber 122 includes outlets for any excess fluid and may also be connected to a pressure system to maintain a target pressure within the processing chamber 122 in certain embodiments. The processing chamber 122 may also include gas inlets such as for pumping inert gases into the processing chamber 122 for certain applications.

Referring to FIG. 1, the first mixer apparatus 100 includes a first supply tank 102 and a second supply tank 104 coupled to a mixer 114 comprising a mixing chamber 112. Although only two sources are illustrated as being mixed, in various embodiments, more than two sources of fluids may be mixed in the mixer 114. The first supply tank 102 and the second supply tank 104 each hold a first liquid and a second liquid, respectively. In various embodiments, the first supply tank 102 and the second supply tank 104 are made of ceramics, glass, stainless steel or any other material depending upon the corrosive properties of the first and second liquids being used.

In various embodiments, the first liquid comprises a first block copolymer comprising a first homopolymer (-A-A- . . . A-A-) and a second homopolymer (-B-B- . . . B-B-). Accordingly, the first homopolymer is a polymer of a first monomer (A) while the second homopolymer is a polymer of a second monomer (B). A block copolymer ((-A-B-)-(-A-B-)- . . . (-A-B-)-(-A-B-)-) is formed when the first homopolymer is mixed with the second homopolymer (B). Examples of homopolymers include methyl-methacrylate, styrene, dimethylsiloxane, ethylene oxide, butadiene, vinylpyridine, isoprene, lactic acid, and others.

In various embodiments, the first homopolymer has a first mole fraction in the first liquid. The second liquid comprises a second block copolymer comprising the first homopolymer and the second homopolymer. The first homopolymer has a second mole fraction in the second liquid. Thus, while both the first liquid and the second liquid have the same polymers, the first mole fraction is different than the second mole fraction.

In one or more embodiments, the first homopolymer is a polystyrene block comprising repeating styrene units and the second homopolymer is a poly methyl-methacrylate block comprising repeating methyl-methacrylate units. The first homopolymer together with the second homopolymer form poly(styrene-b-methyl-methacrylate), i.e., repeating styrene-b-methyl-methacrylate units, which is a block copolymer. Therefore the first liquid and the second liquid both comprise of poly(styrene-b-methylmethacrylate) with different molecular weights. The first liquid and the second liquid are described herein for example only. A person having ordinary skill in the art may use other types of liquids as well.

In various embodiments, the first mole fraction may range from 10% to 90% in the first liquid and the second mole fraction may range from 10% to 90% in the second liquid so long as the first mole fraction and the second mole fraction are different.

In various embodiments, the first mixer apparatus 100 may be gravity driven with few intermediate components or may comprise a system of pumps and valves for control of fluid flow. Accordingly, in certain embodiments, the first mixer apparatus 100 optionally includes a first pump 106a, a second pump 106b, and a third pump 106c, a first shutoff valve 108a, a second shutoff valve 108b, and a third shutoff valve 108c, a first flowmeter 110a, a second flowmeter 110b, and a third flowmeter 110c.

The first supply tank 102 and the second supply tank 104 are both connected to a first pump 106a and a second pump 106b. The first pump 106a and the second pump 106b are respectively connected to a first shutoff valve 108a and a second shutoff valve 108b that are further coupled to the mixer 114. The mixer 114 is connected to the processing tool 124 via an optional third pump 106c connected to a third shutoff valve 108c and a third flowmeter 110c.

As illustrated in FIG. 1, the mixer 114 may be disposed within the mixing chamber 112. As one example, the mixer 114 may be designed as described in Application Ser. No. 62/839,917, filed on Apr. 29, 2019, which is incorporated herein by reference. In certain embodiments, the mixer 114 may be a planetary mixer, a static mixer, or any other mixer known to a person having ordinary skill in the art that can blend liquid mixtures.

The first mixer apparatus 100 may further include an electronic flow control system 115, e.g., to control the various aspects of the fluid flow. The electronic flow control system 115 comprises a controller 116 and various memory, input/output devices, analog to digital converters, and other hardware and software as known to a person with ordinary skill in the art. For example, the controller may comprise a processor, microprocessor, or any other type of controller known in the art. In addition, the electronic flow control system 115 includes sensors such as flow sensors, temperature sensors, and others.

The electronic flow control system 115 is connected to the first pump 106a, the second pump 106b, the third pump 106c, the first shutoff valve 108a, the second shutoff valve 108b, the third shutoff valve 108c, the first flowmeter 110a, the second flowmeter 110b, the third flowmeter 110c, the mixer 112 as well as other components such as the processing tool. More specifically, measurement data from the first flowmeter 110a, the second flowmeter 110b, the third flowmeter 110c may be received at the electronic flow control system 115 while control signals generated at the controller 116 may be sent to the first pump 106a, the second pump 106b, the third pump 106c, the first shutoff valve 108a, the second shutoff valve 108b, the third shutoff valve 108c.

The electronic flow control system 115 may receive measurement or metrology data from sensors 103 and process information including process recipe/metrics 105 such as a target process window. Sensors 103 may include various types of sensors including, but not limited to optical sensors (such as cameras, lasers, light, reflectometer, spectrometers, etc.), capacitive sensors, ultrasonic sensors, gas sensors, temperature sensors to monitor liquid temperature, or other sensors that may monitor the blending process as well as the first liquid, the second liquid, and the blended first mixture. The electronic flow control system 115 may receive additional data inputted by the user including, but not limited to, the target volumes of a first liquid in the first supply tank 102, a second liquid in the second supply tank 104, a first mixture, and a required mixing time. In one example embodiment, a mass spectrometer may be used to determine the composition of the first liquid and the second liquid periodically. In one example embodiment, one or more optical sensors may be used to determine opacity of the first and second liquids periodically that can help determine the validity of the composition.

Based on the data from the various sensors 103 and process recipe/metrics 105, the controller 116 will generate control signals to activate the first pump 106a and the second pump 106b and deactivate the first shutoff valve 108a and the second shutoff valve 108b to dispense the first liquid and the second liquid into the mixer 114. The first pump 106a, the second pump 106b, and the third pump 106c may comprise of any centrifugal pump or any positive displacement pumps that are able to pump liquid block copolymers as known to a person having ordinary skill in the art. The first shutoff valve 108a, the second shutoff valve 108b, and the third shutoff valve 108c may comprise of an electromotive diaphragm valve, an electromotive angle seat valve, or any other valve known to a person having ordinary skill in the art.

As the first and second liquids flow from the first supply tank 102 and the second supply tank 104, the controller 116 constantly or periodically monitors the first flowmeter 110a and the second flowmeter 110b to track the volume of each liquid dispensed into the mixer 114. For example, the first flowmeter 110a, the second flowmeter 110b, and the third flowmeter 110c may comprise of a positive displacement flowmeter that can directly provide the volume of a liquid dispensed with no additional calculation required or any other flowmeter known to a person having ordinary skill in the art.

Once the controller 116 determines, based on data provided by the first flowmeter 110a and the various sensors 103 and process recipe/metrics 105, that the target volume of the first liquid has been dispensed, the controller 116 generates control signals to activate the first shutoff valve 108a and turn off the first pump 106a. Similarly, when the controller 116 determines, based on data provided by the second flowmeter 110b and the various sensors 103 and process recipe/metrics 105, that the target volume of the second liquid has been dispensed the controller 116 (CTLR) generates control signals to activate the second shutoff valve 108b and turn off the second pump 106b.

After the first and second liquids are dispensed into mixer 114, controller 116 will generate control signals to turn on mixer 114 for a duration based on the data received, and the mixer 114 blends the first liquid and the second liquid to form a first mixture.

In various embodiments, the mixer 114 may include a holding tank in which the blended liquids i.e., first mixture, are stored. However, in certain embodiments, the first mixture may be directly injected into the nozzle 118 of the processing tool without any separate holding tanks. In certain embodiments, the nozzle 118 and the holding tank may be integrated together, for example, in a plenum to the processing chamber 122.

After the mixing, the controller 116 generates control signals to activate the optional third pump 106c and deactivate the third shutoff valve 108c so as to inject the first mixture into the nozzle 118 and coat the semiconductor substrate 120 with the first mixture within the process chamber 122.

In an alternative embodiment in order to generate a more uniform fill density across the semiconductor substrate, using the method above, the second liquid may comprise of a solvent. In certain embodiments, the solvent may be added to improve metrics such as surface roughness and other features. In various embodiments, the solvent may be propylene glycol monomethyl ether acetate, toluene, or any other solvent known to mix with block copolymer mixtures in the art. In other embodiments, the solvent may be added from a third supply tank in addition to the second liquid comprising the second block copolymer from the second supply tank 104.

In another alternative embodiment, the second liquid may comprise of essentially the first homopolymer or essentially the second homopolymer. In such embodiments, the first homopolymer or the second homopolymer may help to fine tune a parameter such as critical dimension or pitch of the feature to be patterned.

FIG. 2 illustrates a block copolymer coating tool in accordance with an embodiment of the present application.

As illustrated in FIG. 2, the coating tool includes a second mixer apparatus 200 and a processing tool 124 in which a semiconductor substrate 120 is processed. The second mixer apparatus 200 may include any number of supply containers ranging from 1, 2, 3, . . . N poured into a mixer 114 to form a first mixture of block copolymers that is coated onto the semiconductor substrate 120 through a nozzle 118. The first supply container 1 is configured to hold a first liquid, the second supply container 2 is configured to hold a second liquid, and correspondingly the nth supply container N is configured to hold the nth liquid. For example, the supply containers may be made out of ceramics, glass, stainless steel or any other material known by one with ordinary skill in the art based of the corrosive properties of the liquids.

In various embodiments, the first mixture includes a first liquid held in the first supply container 1 and a second liquid held in the second supply container 2. The first liquid held in the first supply container 1 as described above may be a first homopolymer and a second homopolymer with the first homopolymer having a first mole fraction in the first liquid. The second liquid held in the second supply container 2 as described above may be a first homopolymer and a second homopolymer with the first homopolymer having a second mole fraction in the second liquid.

The liquid valves from the multiple supply containers 1-N may be opened electronically or by the user so that the multiple liquids are blended in the mixer 114 as described above with respect to FIG. 1 to form the first mixture. In the same manner illustrated in FIG. 1, the mixer 114 is connected to the processing tool 124 via the third pump 106c that is connected to the third shutoff valve 108c, and the third flowmeter 110c. The blended first mixture may be held in a holding tank either within the second mixer apparatus 200 or the processing tool 124.

At the conclusion of mixing, the user deactivates the third shutoff valve 108c and turns on the third pump 106c so as to inject the first mixture into the nozzle 118 and coat the semiconductor substrate 120 with first mixture within the processing chamber 122. As the first mixture exits mixer 114, it flows through the third flowmeter 110c and the user constantly or periodically monitors the volume readout of the third flowmeter 110c. Then, once the third flowmeter 110c displays that the desired volume of the first mixture has been dispensed, the user shuts off the third pump 106c and activates the third shutoff valve 108c.

In various embodiments, the semiconductor substrate 120 may undergo a curing process either in the processing tool 124 or in a different tool.

In other embodiments the first mixture may include a third liquid comprising essentially the first homopolymer, essentially the second homopolymer, or a solvent added from a third supply tank 3 in addition to the first liquid and the second liquid. The first homopolymer, the second homopolymer, and solvent are not described again and may be similar to the solvent described above, e.g., with respect to FIG. 1.

In other embodiments the first mixture may include a third liquid comprising essentially the first homopolymer from a third supply tank 3 and a fourth liquid comprising essentially the second homopolymer from a fourth supply tank 4 in addition to the first liquid and the second liquid.

As mentioned above, the first mixture is blended in order to form device features of a semiconductor device using a directed self-assembly (DSA) process.

Although not explicitly described, this embodiment may also include an electronic control system that is coupled to various sensors and data sources to continuously monitor and control the blending process as described with respect to FIG. 1 above and using the flow chart of FIG. 5 below.

FIGS. 3A-3E illustrates cross-sectional views of a semiconductor device during various stages of fabrication in accordance with an embodiment of the present application, where FIG. 3A illustrates the device after forming a patterned photoresist layer, FIG. 3B illustrates the device after coating a mixture comprising a blended block copolymer, FIG. 3C illustrates the device after annealing, FIG. 3D illustrates the device after selectively removing a plurality of regions, and FIG. 3E illustrates the device after forming a first pattern of device elements.

Referring to FIG. 3A, a first patterned photoresist layer 308 is formed over the semiconductor substrate 120. This stage of processing may be performed at any stage of the device fabrication such as fin formation, gate formation, metal lines, contact plugs, vias, and so on.

The semiconductor substrate 120 includes a semiconductor body 320 supporting a first layer to be patterned 306 on which the first patterned photoresist layer 308 is formed. The semiconductor body 320 may be bulk substrate such as a bulk silicon substrate, a silicon-on-insulator substrate, a silicon carbide substrate, a gallium arsenide substrate, or hybrid substrates such as gallium nitride on silicon and other heteroepitaxial substrates, or any other configuration and material known by one with ordinary skill in the art.

The first layer to be patterned 306 may be the layer that forms the device feature or it may be an intervening layer that is used to subsequently form the device feature. An example of such an intervening layer may be a hard mask layer that is used to subsequently pattern a feature in an underlying layer. In various embodiments, the first layer to be patterned 306 may be an insulating layer, a conductive layer, a semiconductor layer depending on the feature being fabricated at this stage of fabrication.

As known to a person having ordinary skill in the art, embodiments of the present invention contemplate the presence of other intervening layers. For example, an antireflective coating layer 307 may be formed before forming the first patterned photoresist layer 308. The antireflection coating (ARC) film may comprise a silicon antireflection coating in one embodiment. In certain embodiments, the antireflective coating layer 307 may comprise an organic ARC layer, a metal ARC layer, a metal oxide ARC layer, or a titanium nitride ARC layer. The antireflective coating layer 307 has to also avoid interaction between material of the directed self-assembly being formed (i.e., the first or second homopolymer chains present in the first mixture being deposited as will be described below) and the underlying first layer to be patterned 306.

In various embodiments, the first patterned photoresist layer 308 serves as a first DSA template in that the underlying features are aligned to the first patterned photoresist layer 308. The first patterned photoresist layer 308 may comprise a positive, a negative, or a hybrid photoresist. In one embodiment, the first patterned photoresist layer 308 is formed by spin coating a resist material over the first layer to be patterned 306, baking the resist material to form a photoresist, exposing the photoresist using lithography, and developing the exposed photoresist.

The first patterned photoresist layer 308 has an opening thus formed with a specific width 302 and critical dimension 304 defined during the lithographic process. Advantageously, the dimensions of the specific width 302 and critical dimension 304 are much larger than the feature being formed, and therefore a lower resolution (therefore lower cost) lithography process can be used to form these features.

Referring to FIG. 3B, the first mixture 310, blended in the mixer 114 within the same fabrication facility, is coated within the first patterned photoresist layer 308 via the first mixer apparatus 100 or the second mixer apparatus 200 as discussed in more detail above with respect to FIG. 1 and FIG. 2. For sake of clarity, the filling of the adjacent openings of the first patterned photoresist layer 308 is not shown in FIGS. 3B-3E. The first mixture 310 is coated over the first patterned photoresist layer 308 and fills the openings between the patterns of the first patterned photoresist layer 308.

In one embodiment, the first mixture 310 has a first ratio of the first liquid comprising a first block copolymer liquid to the second liquid comprising a second block copolymer liquid. In another embodiment, the first mixture 310 is a mixture of a first block copolymer liquid blended with a solvent as described in FIG. 1 or 2. In yet another embodiment, the first mixture 310 is a mixture of a first block copolymer liquid blended with a homopolymer as described in FIG. 1 or 2. Accordingly, in various embodiments, the first mixture 310 has first block copolymer liquid blended with one or more of a second block copolymer liquid, a solvent, or a homopolymer as described in FIG. 1 or 2.

Referring to FIG. 3C, the semiconductor substrate 120 is annealed which causes the first homopolymer and the second homopolymer, present in the first mixture 310, to separate and form a first plurality of regions 312 and a second plurality of regions 314 that alternate between each homopolymer and are aligned with the first patterned photoresist layer 308. The first plurality of regions 312 correspond to the first homopolymer and the second plurality of regions 314 correspond to the second homopolymer. In various embodiments, the pitch between neighboring first plurality of regions 312 or between neighboring second plurality of regions 314 may vary between 10 nm to 100 nm, thus enabling forming structures that are lower than the resolution limit of the lithography process used to pattern the first patterned photoresist layer 308.

Annealing may include furnace annealing, lamp based annealing, rapid thermal annealing, or any other annealing method known by one with ordinary skill in the art. In various embodiments, the annealing may be performed between 100° C. to 700° C., and in one embodiment between 200° C. and 400° C.

As is known to a person having ordinary skill in the art, the chemical composition of the block copolymer may be tailored by varying the composition and mole fraction of the homopolymers to control the type of phase separation after annealing. During annealing, the homopolymers undergo microphase separation forming repeating patterns or periodic structures. The type of pattern may be spheres of the first homopolymer embedded in a matrix of the second homopolymer (or vice versa), hexagonal close packed cylinders of the first homopolymer embedded in a matrix of the second homopolymer (or vice versa), gyroid, or lamellae of alternating first homopolymer and second homopolymer. Of these possible structures, from a lithography perspective, lines can be formed from alternating lamellae while the hexagonal closed packed cylinders can be used for forming an array of contact holes. In the illustration described herein, the first plurality of regions 312 and the second plurality of regions 314 are selected to form in a lamellar shape. However, in other embodiments, the first plurality of regions 312 and the second plurality of regions 314 may be selected to form cylinders of the first plurality of regions 312 in the second plurality of regions 314 (or vice versa).

Further, one of the homopolymers has more affinity towards the first patterned photoresist layer 308 and is formed contacting the sidewalls of the first patterned photoresist layer 308. In this example illustration, the first plurality of regions 312 preferentially forms on the sidewalls of the first patterned photoresist layer 308.

Referring to FIG. 3D, one of either the first plurality of regions 312 or the second plurality of regions 314 is selectively removed forming a first etch mask in the first patterned photoresist layer 308. In various embodiments, the first plurality of regions 312 corresponding to the first homopolymer are removed and the second plurality of regions 314 corresponding to the second homopolymer form a first etch mask in the first patterned photoresist layer 308. In alternative embodiments, the second plurality of regions 314 corresponding to the second homopolymer may be selectively removed and the first plurality of regions 312 corresponding to the first homopolymer may form the first etch mask.

The removal of the first plurality of regions 312 or the second plurality of regions 314 may be performed using either wet or dry chemistry. For example, a dry oxygen plasma may be used to remove a poly methyl-methacrylate. If the selectivity of this etch process is poor, some of the second plurality of regions 314 will be removed while removing the first plurality of regions 312. In some embodiments, this may be used to advantageously reduce the critical dimension of the remaining second plurality of regions 314. However, lateral etching of the second plurality of regions 314 may not be preferred in certain embodiments, as it may be difficult to control the vertical nature of the sidewall profile needed for patterning the layer to be patterned 306 in the next step.

Referring to FIG. 3E, using the first etch mask, the first pattern of device elements 316 with a first critical dimension 318 and a first pitch 321 are formed in the layer to be patterned 306. In this case, the first patterned photoresist layer 308 is removed prior to the etching. Of course if a plurality of trenches is being formed in the layer to be patterned 306, the first patterned photoresist layer 308 may be removed after the patterning of the layer to be patterned 306. As known to a person having ordinary skill in the art, an anisotropic reactive ion etching process may be used to pattern the layer to be patterned 306. Any remaining second plurality of regions 314 is removed as well after patterning the layer to be patterned 306.

As previously described, the first critical dimension 318 and the first pitch 321 formed are based on the first ratio of the liquids being blended in the first mixture, e.g., ratio of first block copolymer and second block copolymer or ratio of first block copolymer and a homopolymer. The first patterned photoresist layer 308 and the etch mask formed by the second plurality of elements are removed.

Figure 4:
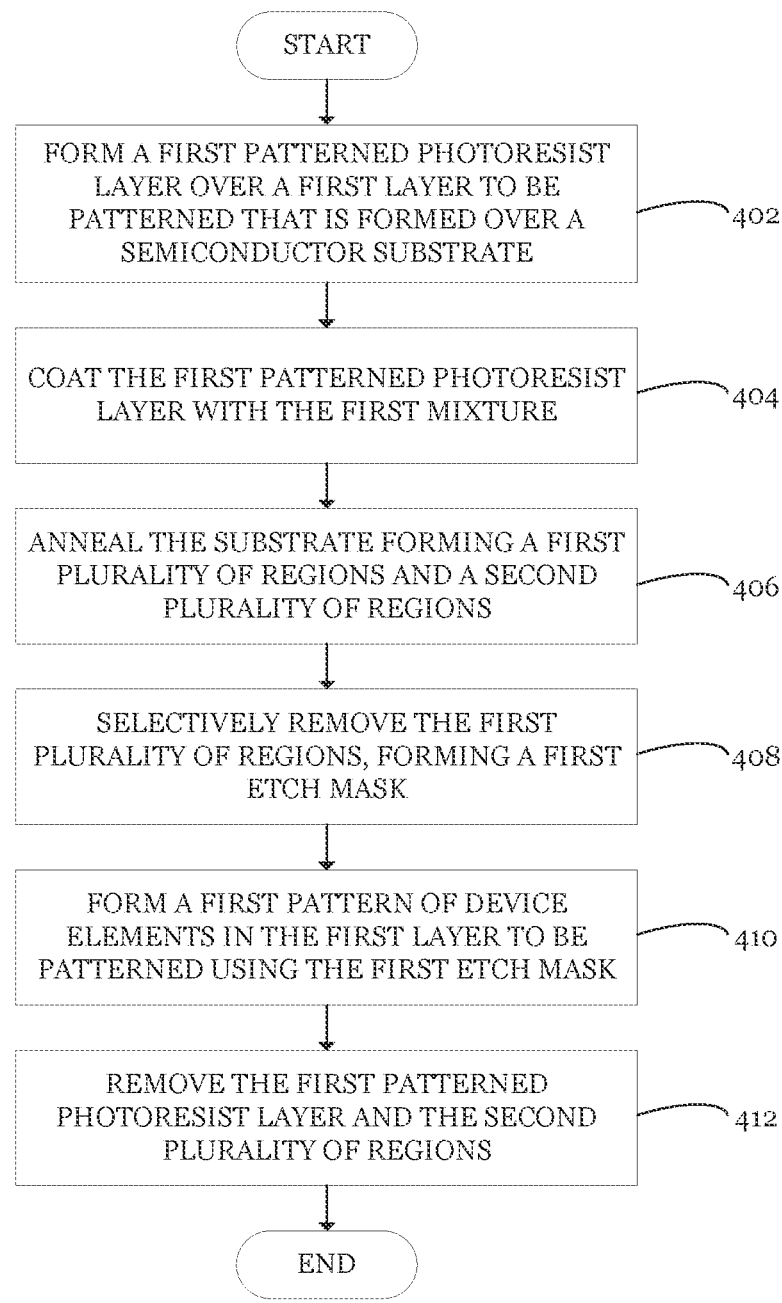
FIG. 4 is a flow chart of a directed self-assembly method for forming a first pattern of device in accordance with an embodiment of the present application.

FIG. 4 is a flow chart of a first directed self-assembly method to form a first pattern of device elements in accordance with an embodiment of the present disclosure.

In block 402, a first patterned photoresist layer 308 is formed over a first layer to be patterned 306 that is formed over a semiconductor substrate 120. This first patterned photoresist layer 308 may be formed as described and illustrated using FIG. 3A.

As next illustrated in block 404 and described with respect to FIG. 3B, the first patterned photoresist layer 308 is coated with the first mixture 310. The forming of the first mixture 310 is described with respect to FIGS. 1 and 2. In various embodiments, as discussed above, the first mixture 310 is a combination of two or more of a first block copolymer, a second block copolymer, a solvent, and a homopolymer that are blended using the first mixer apparatus 100 or the second mixer apparatus 200. Advantageously, the blending of the first mixture 310 and the coating of the first mixture 310 over the semiconductor substrate 120 happens in the same fabrication facility. Further, this blending may happen closely spaced in time with the coating process to avoid chemical deterioration due to extended storage.

Referring next to block 406 and described with respect to FIG. 3C, the substrate is annealed to form a first plurality of regions 312 and a second plurality of regions 314.

As next illustrated in block 408 and described with respect to FIG. 3D, the first plurality of regions 312 is selectively removed to form a first etch mask.

As next illustrated in block 410 and described with respect to FIG. 3E, after removing any remaining first patterned photoresist layer, a first pattern of device elements 316 is formed using the first etch mask.

As mentioned above, an advantage of blending block copolymers within a fabrication facility is that if a metric of the first formed pattern does not meet a target metric, the blended block copolymer mixture can be tuned within the fabrication facility in lieu of ordering a new mixture from a vendor.

Figure 5:
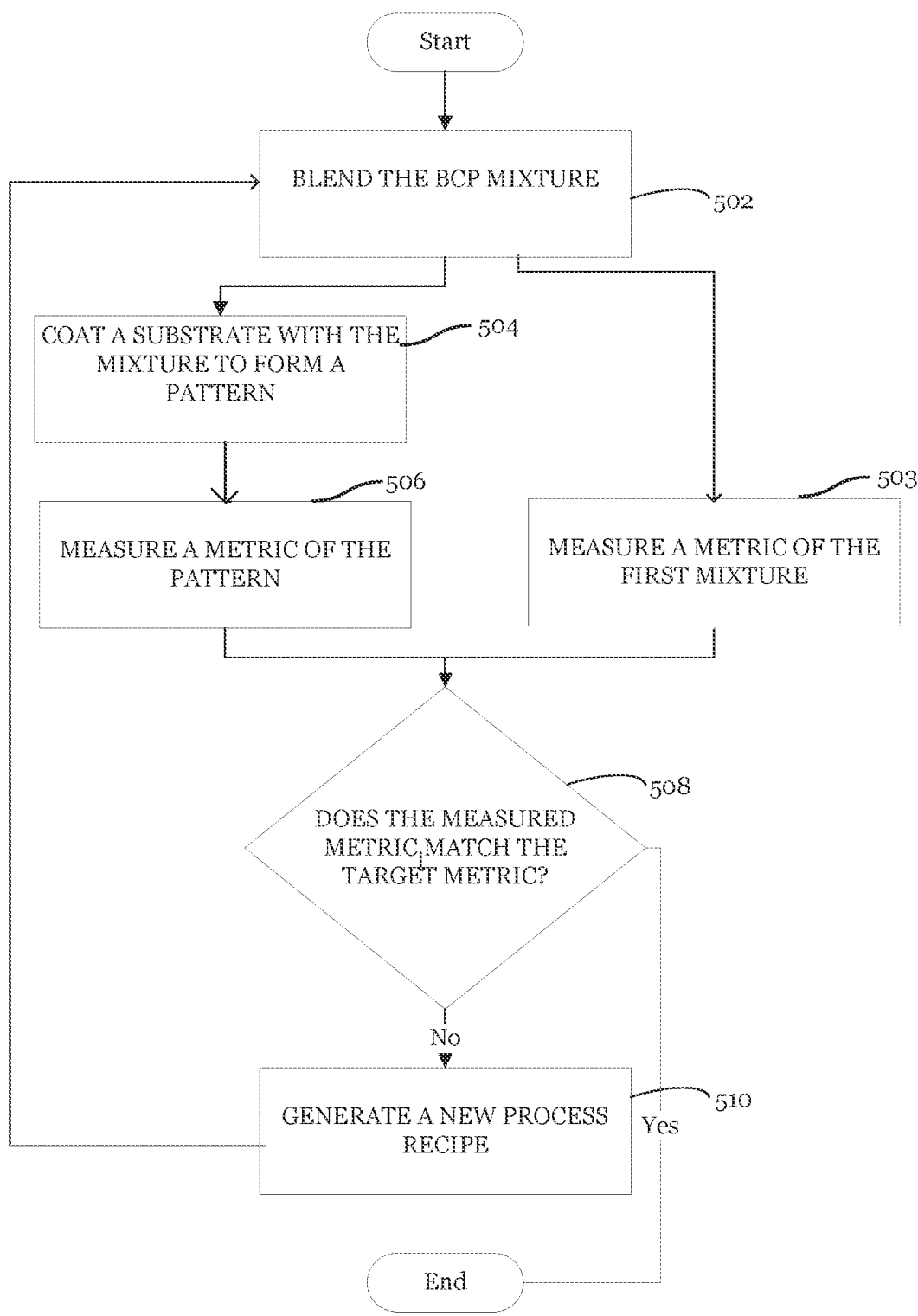
FIG. 5 is a flow chart of the method for tuning a first block copolymer mixture within a fabrication facility in order to meet a target metric in accordance with an embodiment of the present application.

FIG. 5 a flow chart of a method for tuning a first block copolymer mixture within a fabrication facility in order to meet a target metric.

As illustrated in block 502, a block copolymer (BCP) mixture such as the first mixture 310 is blended within the fabrication facility using the first mixer apparatus 100 or the second mixer apparatus 200, as described above using FIG. 1 and FIG. 2, respectively. In various embodiments, as discussed above, the first mixture 310 is a combination of two or more of a first block copolymer, a second block copolymer, a solvent, and a homopolymer that are blended using the first mixer apparatus 100 or the second mixer apparatus 200.

It is conceivable that during production or during process development, the features of the pattern or the blended mixture may not be within a desired target window. This may eventually cause a loss in product yield and therefore embodiments of the present disclosure envision a process control in which the metrics measured at blocks 503 and 506 are actively or periodically monitored and provided to an electronic flow control system 115 such as described in FIG. 1.

As next illustrated in block 503, the blended block copolymer mixture, the first liquid, or the second liquid may be analyzed with various metrology tools including sensors such as sensors 103 described with respect to FIG. 1. Alternatively, or in addition, to the above metrology of block 503, as next illustrated in block 504, a semiconductor substrate 120 is coated with the first mixture 310 and a pattern of device elements 316 is formed on the semiconductor substrate 120 as described using FIGS. 3A-3E, 4 above. In this case, a metric of the pattern of device elements 316 is measured. In further embodiments, a pattern of the second plurality of regions 314 is measured prior to forming the device elements 316. Accordingly, in various embodiments, the measured metric may be the critical dimension of the device elements 316/second plurality of regions 314, the width (dimension orthogonal to the critical dimension) of the device elements 316/second plurality of regions 314, the height or the depth of the device elements 316/second plurality of regions 314, the distance between neighboring elements, i.e., the pitch of the device elements 316/second plurality of regions 314, the surface roughness of the device elements 316/second plurality of regions 314, the local critical dimension uniformity of the device elements 316/second plurality of regions 314, the line width variation of the device elements 316/second plurality of regions 314, the sidewall angle of the device elements 316/second plurality of regions 314, the microphase structure, or any other metric. These metrology measurements may be made using inline tools such as optical metrology tools such as scatterometry that use non-destructive testing or other metrology tools that may use destructive testing such as using optical or electron microscopy.

The measured metric is compared to a target metric or target process window, for example, obtained from process recipe/metrics 105 described in FIG. 5. This may be done in the electronic control system described in FIG. 1, for example. If the measured metric is the same as the target metric or within the process window, no change to the blended liquid or to the process is made at this time. If the measured metric is different than the target metric or outside the process window, the process continues to step 510 and a new or modified recipe for the block copolymer mixture is generated in accordance with FIG. 1 or FIG. 2. The new mixture may change any of the process parameters such as flow rate and/or pressure of the first liquid or the second liquid, temperature as well as other parameters.

In various embodiments, if the target metric is the critical dimension or pitch, and the measured critical dimension or pitch does not meet the target metric, the first mixture can be further blended with a third liquid comprising essentially of the first homopolymer or essentially the second homopolymer to form a tuned second mixture with a new critical dimension or pitch.

In alternative embodiments, if the target metric is the critical dimension or pitch, and the measured critical dimension or pitch does not meet the target metric, the first mixture can be further blended with a third liquid comprising essentially of the first homopolymer and a fourth liquid comprising essentially of the second homopolymer to form a tuned second mixture with a new critical dimension or pitch.

In alternative embodiments, if the target metric is the surface roughness and the measured surface roughness does not meet the target surface roughness, the first mixture can be further blended with a third liquid comprising a solvent to form a new mixture with an improved film thickness. For example, the solvent may comprise of propylene glycol monomethyl ether acetate, toluene, or any other solvent known to change the film thickness of block copolymers known in the art.

In alternative embodiments, the microphase of the first mixture may be improper. For example, the microphase may be hexagonal instead of lamellar. In such cases, the first mixture may be further blended with a third liquid comprising essentially of the first homopolymer or essentially of the second homopolymer in order to change the phase of the blended mixture from hexagonal to lamellae and vice-versa. In various embodiments, as previously described, the phase may be changed between close-packed cylinders, hexagonal, and lamellae by changing the composition of the homopolymers in the block copolymers.

The process of blocks 502 through 508 are repeated with the new mixture blended or modified with the new process recipe.

As mentioned above, another advantage of the disclosed invention is that it allows for multiple layers of IC device elements with different critical dimensions, pitches, and/or shapes to be fabricated on the same semiconductor substrate by blending multiple block copolymer mixtures corresponding to each successive layer of device elements within the fabrication facility.

Figure 6A:
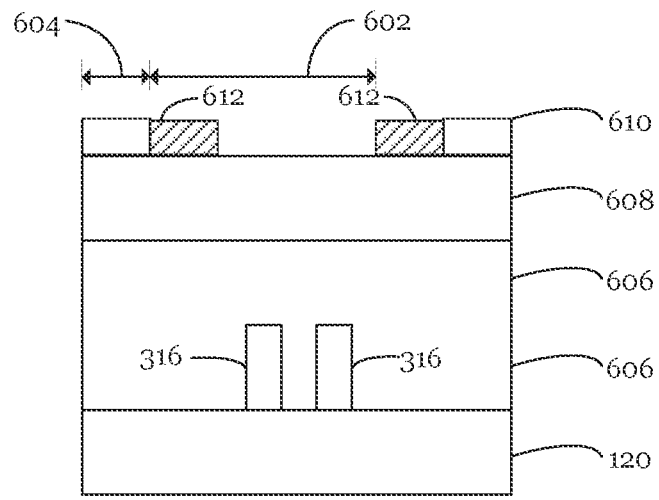
Figure 6B:
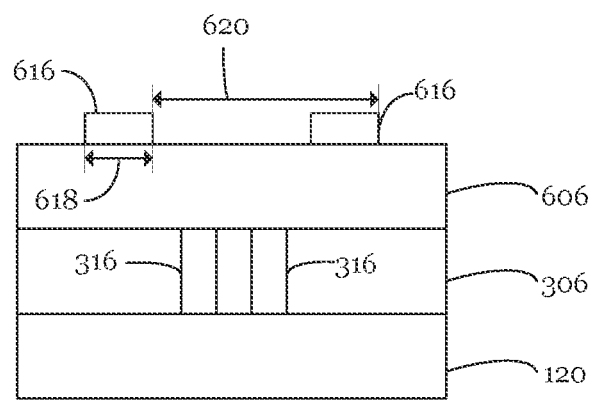
Figure 7:
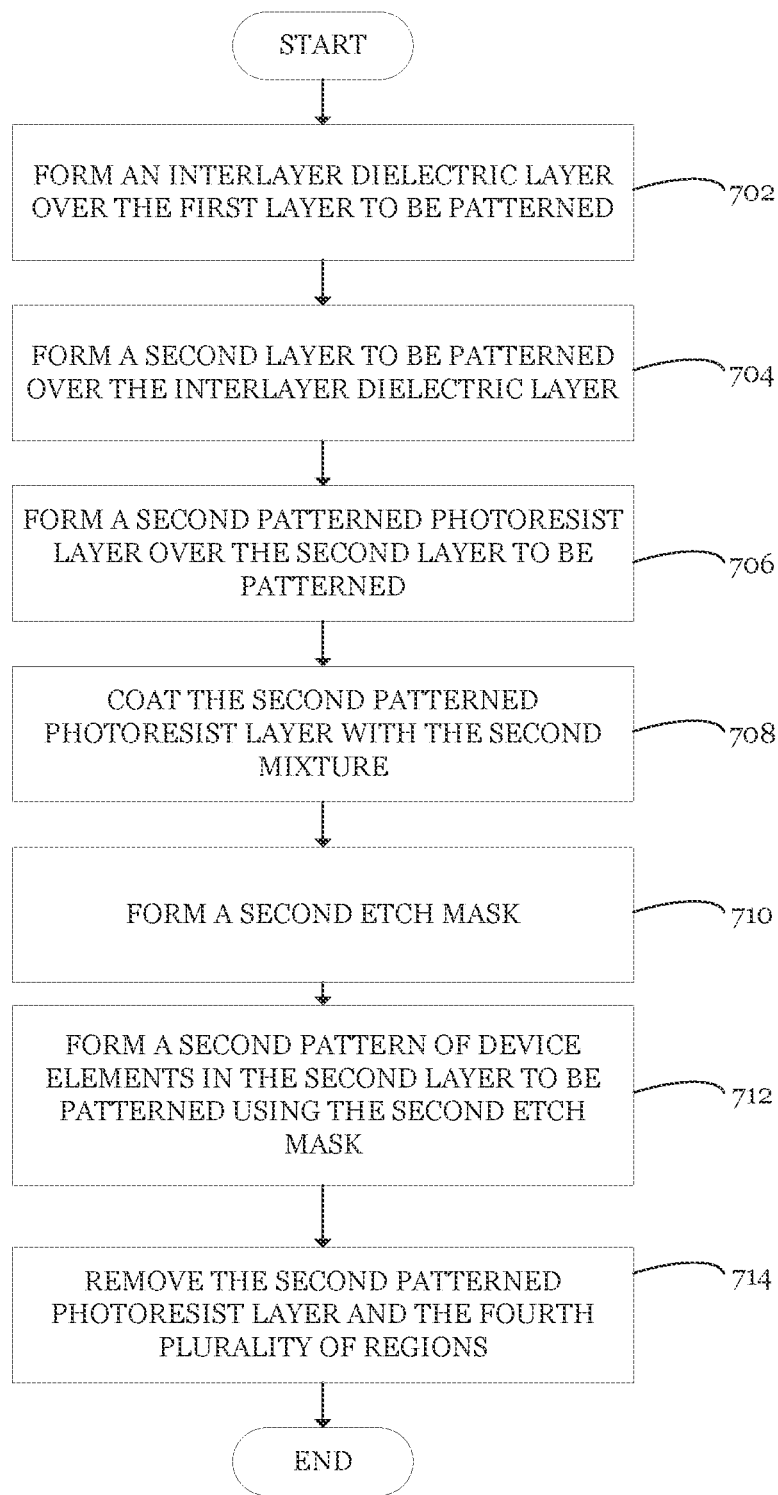
FIG. 7 is a flow chart of a directed self-assembly method for forming a second pattern of device elements over a first pattern of device elements in accordance with an embodiment of the present application.

FIGS. 6A-6B illustrate cross-sectional views of a semiconductor device during various stages of fabrication in accordance with an embodiment of the present application, wherein FIG. 6A illustrates the device after coating a second patterned photoresist layer with a second block copolymer mixture, and FIG. 6B illustrates the device after forming a second patterned layer of device elements. FIG. 7 is a flow chart of a second DSA method used to form a second layer of device elements for the fabrication process illustrated in FIGS. 6A-6B.

In this embodiment, a blended mixture with a different composition is formed using the same supply tanks that were previously used to pattern device elements for a different process step. Advantageously, different critical dimensions can be achieved with the same mixing apparatus without having to change supply bottles.

Accordingly, this embodiment continues from FIG. 3E. Referring now to FIG. 6A and block 702, an interlayer dielectric layer 606 is formed over device elements 316 formed in FIG. 3E, for example. The interlayer dielectric layer 606 may comprise a plurality of layer and may comprise SiO2, SION, Si3N4, glasses such as borosilicate glass, organo silicate glass, low-k dielectric materials, or any other interlayer dielectric known by one with ordinary skill in the art.

Next, a second layer to be patterned 608 is formed over the interlayer dielectric layer 606 (block 704) and may also comprise a dielectric layer, a conductive layer, or semiconductor layer depending on the feature being formed.

Next, a second patterned photoresist layer is formed over the second layer to be patterned 608 (block 706). As illustrated in FIG. 6A, a second patterned photoresist layer 610 is formed over the second layer to be patterned 608. The second patterned photoresist layer 610 may comprise the same material and may be formed in the same manner as the first patterned photoresist layer 308, as illustrated in FIG. 3A. The second patterned photoresist layer 610 is patterned with a second specific pitch 602 and a second specific critical dimension 604. The second patterned photoresist layer 610 serves as a second DSA template.

The second patterned photoresist layer 610 is coated with the second mixture (block 708). The second mixture has a composition that is different from the first mixture used in FIG. 3B. In one embodiment, the second mixture has a second ratio of the first liquid comprising a first block copolymer liquid to the second liquid comprising a second block copolymer liquid. The second ratio is selected to achieve a target second critical dimension for the features being patterned while the first ratio was selected to achieve a different target first critical dimension for the features being patterned. Similar to the first mixture, in various embodiments, the second mixture has first block copolymer liquid blended with one or more of a second block copolymer liquid, a solvent, or a homopolymer as described in FIG. 1 or 2. Similar to the first mixture, the second mixture is then coated onto the second patterned photoresist layer 610 via the first mixer apparatus 100 or the second mixer apparatus.

Referring to block 710, a second etch mask 612 is formed by annealing the substrate to cause microphase separation (e.g., similar to FIG. 3D) and then removing one of the phase regions.

Referring to FIG. 6B, using the second etch mask 612, a second pattern of device elements 616 with a second critical dimension 618 and a second pitch 620 are formed (block 712). The second critical dimension 618 and the second pitch 620 formed are based on the second ratio of the first liquid to the second liquid in the second mixture. The second patterned photoresist layer 610 and the second etch mask 612 are removed (block 714).

In various embodiments, the first DSA process is used to form a first pattern of gate lines and the second DSA process is used to form a second pattern of metal lines over the gate lines. In alternative embodiments the first DSA process is used to form a first pattern of gate lines and the second DSA process is used to form a second pattern of contact holes within the gate lines.

Advantageously, as discussed in the embodiments described using FIGS. 3A-3E and then FIGS. 6A-6B, two different patterns with different critical dimensions and pitch may be formed using a common source of supply tanks. This advantage scales quickly if more levels use a directed self-assembly process as additional patterns at other critical dimensions may be fabricated with the same number of supply tanks/liquids.

Examples of embodiments are described below.

Example 1. A method for forming a device includes blending, in a mixer within a fabrication facility, a first liquid including a first block copolymer with a second liquid including a second block copolymer to form a first mixture, the first block copolymer including a first homopolymer and a second homopolymer, the first homopolymer having a first mole fraction in the first liquid, the second block copolymer including the first homopolymer and the second homopolymer, the first homopolymer having a second mole fraction in the second liquid, the first mole fraction being different from the second mole fraction; placing a substrate over a substrate holder of a processing chamber within the fabrication facility; and coating the substrate with the first mixture within the processing chamber.

Example 2. The method of example 1, further including: forming a patterned photoresist layer over a layer to be patterned that is disposed over the substrate, where coating the substrate with the first mixture includes coating the patterned photoresist layer with the first mixture; annealing to form a first plurality of regions including the first homopolymer and a second plurality of regions including the including the second homopolymer; selectively removing the first plurality of regions to form an etch mask aligned with the patterned photoresist layer, the etch mask including the second plurality of regions; and forming a pattern in the layer to be patterned using the etch mask.

Example 3. The method of one of examples 1 or 2, further including removing the patterned photoresist layer, and removing the second plurality of regions after forming the pattern.

Example 4. The method of one of examples 1 to 3, further including: forming a first pattern from the coating of the first mixture; measuring a first critical dimension of a feature of the first pattern; in response to determining that the first critical dimension is different from a target critical dimension, blending, at the mixer, the first liquid with the second liquid to form a second mixture, the first mixture including a first ratio of the first block copolymer with the second block copolymer, the second mixture including a second ratio of the first block copolymer with the second block copolymer, the second ratio being different than the first ratio; and coating a further substrate with the second mixture; and forming a second pattern from the coating of the second mixture, where a second critical dimension of a feature of the second pattern meets a target critical dimension.

Example 5. The method of one of examples 1 to 4, further including: blending, at the mixer, the first liquid with the second liquid to form a second mixture, the first mixture including a first ratio of the first block copolymer with the second block copolymer, the second mixture including a second ratio of the first block copolymer with the second block copolymer, the second ratio being different than the first ratio; and coating the substrate with the second mixture.

Example 6. The method of one of examples 1 to 5, further including: forming a first pattern by using a first directed self-assembly process based on the first mixture; and forming a second pattern by using a second directed self-assembly process based on the second mixture, where a first critical dimension of a feature of the first pattern is different from a second critical dimension of a feature of the second pattern.

Example 7. The method of one of examples 1 to 6, where the first directed self-assembly process includes: forming a first patterned photoresist layer over a first layer to be patterned disposed over the substrate, where coating the substrate with the first mixture includes coating the first patterned photoresist layer with the first mixture, annealing to form a first plurality of regions including the first homopolymer and a second plurality of regions including the second homopolymer, selectively removing the first plurality of regions to form a first etch mask aligned with the first patterned photoresist layer, the first etch mask including the second plurality of regions, and forming the first pattern in the first layer to be patterned using the first etch mask; and where the second directed self-assembly process includes forming, a second patterned photoresist layer over a second layer to be patterned disposed over the substrate, where coating the substrate with the second mixture includes coating the second patterned photoresist layer with the second mixture, annealing to form a third plurality of regions including the first homopolymer and a fourth plurality of regions including the second homopolymer, selectively removing the third plurality of regions to form a second etch mask aligned with the second patterned photoresist layer, the second etch mask including the fourth plurality of regions, and forming a second pattern in the second layer to be patterned using the second etch mask.

Example 8. The method of one of examples 1 to 7, where the first pattern is a pattern for gate lines, and where the second pattern is a pattern for metal lines over the gate lines.

Example 9. The method of one of examples 1 to 8, where the first pattern is a pattern for gate lines, and where the second pattern is a pattern to form contact holes in the gate lines.

Example 10. The method of one of examples 1 to 9, where coating the substrate includes: spinning the substrate holder with the substrate; and injecting the first mixture through a nozzle connected to the mixer, the nozzle being directed towards the substrate in order to coat the substrate with the first mixture.

Example 11. The method of one of examples 1 to 10, where, during the blending, the method further includes adding a third liquid including essentially the first homopolymer to form the first mixture.

Example 12. The method of one of examples 1 to 11, where, during the blending, the method further includes adding a fourth liquid including essentially the second homopolymer to form the first mixture.

Example 13. A method for forming a device includes blending, in a mixer within a fabrication facility, a first block copolymer and a solvent to form a first mixture, the first block copolymer including a first homopolymer and a second homopolymer; placing a substrate over a substrate holder of a processing chamber within the fabrication facility; and coating the substrate with the first mixture within the processing chamber.

Example 14. The method of example 13, further including: forming a first pattern from the coating of the first mixture; measuring a first metric of a feature of the first pattern; in response to determining that the first metric is different from a target metric, blending, at the mixer, the first block copolymer with the solvent to form a second mixture, the first mixture including a first ratio of the first block copolymer with the solvent, the second mixture including a second ratio of the first block copolymer with the solvent, the second ratio being different than the first ratio; and coating a further substrate with the second mixture; and forming a second pattern from the coating of the second mixture, where a second metric of a feature of the second pattern meets a target metric.

Example 15. The method of one of examples 13 or 14, where the first metric, second metric, and the target metric are measures of a surface roughness.

Example 16. The method of one of examples 13 to 15, further including: forming a patterned photoresist layer over a layer to be patterned that is disposed over the substrate, where coating the substrate with the first mixture includes coating the patterned photoresist layer with the first mixture while delivering a solvent to the first mixture; annealing to form a first plurality of regions including the first homopolymer and a second plurality of regions including the including the second homopolymer; selectively removing the first plurality of regions to form an etch mask aligned with the patterned photoresist layer, the etch mask including the second plurality of regions; and forming a pattern in the layer to be patterned using the etch mask.

Example 17. A method for forming a device includes blending, in a mixer within a fabrication facility, a first liquid including a first block copolymer and a second liquid including essentially a first homopolymer to form a first mixture, the first block copolymer including the first homopolymer and a second homopolymer; placing a substrate over a substrate holder of a processing chamber within the fabrication facility; and coating the substrate with the first mixture within the processing chamber.

Example 18. The method of example 17, where, during the blending, the method further includes adding a third liquid including essentially the first homopolymer to form the first mixture.

Example 19. The method of one of examples 17 or 18, where, during the blending, the method further includes adding a third liquid including essentially a solvent to form the first mixture.

Example 20. The method of one of examples 17 to 19, further including: forming a first pattern from the coating of the first mixture; measuring a first critical dimension of a feature of the first pattern; in response to determining that the first critical dimension is different from a target critical dimension, blending, at the mixer, the first liquid with the second liquid to form a second mixture, the first mixture including a first ratio of the first liquid with the second liquid, the second mixture including a second ratio of the first liquid with the second liquid, the second ratio being different than the first ratio; and coating a further substrate with the second mixture; and forming a second pattern from the coating of the second mixture, where a second critical dimension of a feature of the second pattern meets a target critical dimension.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a device comprising:
blending, in a mixer within a fabrication facility, a first liquid comprising a first block copolymer with a second liquid comprising a second block copolymer to form a first mixture, the first block copolymer comprising a first homopolymer and a second homopolymer, the first homopolymer having a first mole fraction in the first liquid, the second block copolymer comprising the first homopolymer and the second homopolymer, the first homopolymer having a second mole fraction in the second liquid, the first mole fraction being different from the second mole fraction;
placing a substrate over a substrate holder of a processing chamber within the fabrication facility; and
coating the substrate with the first mixture within the processing chamber.

2. The method of claim 1, further comprising:
forming a patterned photoresist layer over a layer to be patterned that is disposed over the substrate, wherein coating the substrate with the first mixture comprises coating the patterned photoresist layer with the first mixture;
annealing to form a first plurality of regions comprising the first homopolymer and a second plurality of regions comprising the second homopolymer;
selectively removing the first plurality of regions to form an etch mask aligned with the patterned photoresist layer, the etch mask comprising the second plurality of regions; and
forming a pattern in the layer to be patterned using the etch mask.

3. The method of claim 2, further comprising removing the patterned photoresist layer, and removing the second plurality of regions after forming the pattern.

4. The method of claim 1, further comprising:
forming a first pattern from the coating of the first mixture;
measuring a first critical dimension of a feature of the first pattern;
in response to determining that the first critical dimension is different from a target critical dimension, blending, at the mixer, the first liquid with the second liquid to form a second mixture, the first mixture comprising a first ratio of the first block copolymer with the second block copolymer, the second mixture comprising a second ratio of the first block copolymer with the second block copolymer, the second ratio being different than the first ratio; and
coating a further substrate with the second mixture; and
forming a second pattern from the coating of the second mixture, wherein a second critical dimension of a feature of the second pattern meets a target critical dimension.

5. The method of claim 1, further comprising:
blending, at the mixer, the first liquid with the second liquid to form a second mixture, the first mixture comprising a first ratio of the first block copolymer with the second block copolymer, the second mixture comprising a second ratio of the first block copolymer with the second block copolymer, the second ratio being different than the first ratio; and
coating the substrate with the second mixture.

6. The method of claim 5, further comprising:
forming a first pattern by using a first directed self-assembly process by applying the first mixture; and
forming a second pattern by using a second directed self-assembly process by applying the second mixture, wherein a first critical dimension of a feature of the first pattern is different from a second critical dimension of a feature of the second pattern.

7. The method of claim 6,
wherein the first directed self-assembly process comprises:
forming a first patterned photoresist layer over a first layer to be patterned disposed over the substrate, wherein coating the substrate with the first mixture comprises coating the first patterned photoresist layer with the first mixture,
annealing to form a first plurality of regions comprising the first homopolymer and a second plurality of regions comprising the second homopolymer,
selectively removing the first plurality of regions to form a first etch mask aligned with the first patterned photoresist layer, the first etch mask comprising the second plurality of regions, and
forming the first pattern in the first layer to be patterned using the first etch mask; and
wherein the second directed self-assembly process comprises forming, a second patterned photoresist layer over a second layer to be patterned disposed over the substrate, wherein coating the substrate with the second mixture comprises coating the second patterned photoresist layer with the second mixture, annealing to form a third plurality of regions comprising the first homopolymer and a fourth plurality of regions comprising the second homopolymer, selectively removing the third plurality of regions to form a second etch mask aligned with the second patterned photoresist layer, the second etch mask comprising the fourth plurality of regions, and forming a second pattern in the second layer to be patterned using the second etch mask.

8. The method of claim 6, wherein the first pattern is a pattern for gate lines, and wherein the second pattern is a pattern for metal lines over the gate lines.

9. The method of claim 6, wherein the first pattern is a pattern for gate lines, and wherein the second pattern is a pattern to form contact holes in the gate lines.

10. The method of claim 1, wherein coating the substrate comprises:

spinning the substrate holder with the substrate; and injecting the first mixture through a nozzle connected to the mixer, the nozzle being directed towards the substrate in order to coat the substrate with the first mixture.

11. The method of claim 1, wherein, during the blending, the method further comprises adding a third liquid comprising essentially the first homopolymer to form the first mixture.

12. The method of claim 11, wherein, during the blending, the method further comprises adding a fourth liquid comprising essentially the second homopolymer to form the first mixture.

13. A method for forming a device, the method comprising:

blending, in a mixer within a fabrication facility, a first block copolymer and a solvent to form a first mixture, the first block copolymer comprising a first homopolymer and a second homopolymer;

placing a substrate over a substrate holder of a processing chamber within the fabrication facility; and coating the substrate with the first mixture within the processing chamber.

14. The method of claim 13, further comprising:

forming a first pattern from the coating of the first mixture;

measuring a first metric of a feature of the first pattern;

in response to determining that the first metric is different from a target metric, blending, at the mixer, the first block copolymer with the solvent to form a second mixture, the first mixture comprising a first ratio of the first block copolymer with the solvent, the second mixture comprising a second ratio of the first block copolymer with the solvent, the second ratio being different than the first ratio; and coating a further substrate with the second mixture; and forming a second pattern from the coating of the second mixture, wherein a second metric of a feature of the second pattern meets a target metric.

15. The method of claim 14, wherein the first metric, second metric, and the target metric are measures of a surface roughness.

16. The method of claim 13, further comprising:

forming a patterned photoresist layer over a layer to be patterned that is disposed over the substrate, wherein coating the substrate with the first mixture comprises coating the patterned photoresist layer with the first mixture while delivering a solvent to the first mixture;

annealing to form a first plurality of regions comprising the first homopolymer and a second plurality of regions comprising the second homopolymer;

selectively removing the first plurality of regions to form an etch mask aligned with the patterned photoresist layer, the etch mask comprising the second plurality of regions; and forming a pattern in the layer to be patterned using the etch mask.

17. A method for forming a device comprising:

blending, in a mixer within a fabrication facility, a first liquid comprising a first block copolymer and a second liquid comprising a first homopolymer to form a first mixture, the first block copolymer comprising the first homopolymer and a second homopolymer;

placing a substrate over a substrate holder of a processing chamber within the fabrication facility; and coating the substrate with the first mixture within the processing chamber.

18. The method of claim 17, wherein, during the blending, the method further comprises adding a third liquid comprising the first homopolymer to form the first mixture.

19. The method of claim 17, wherein, during the blending, the method further comprises adding a third liquid comprising a solvent to form the first mixture.

20. The method of claim 17, further comprising:

forming a first pattern from the coating of the first mixture;

measuring a first critical dimension of a feature of the first pattern;

in response to determining that the first critical dimension is different from a target critical dimension, blending, at the mixer, the first liquid with the second liquid to form a second mixture, the first mixture comprising a first ratio of the first liquid with the second liquid, the second mixture comprising a second ratio of the first liquid with the second liquid, the second ratio being different than the first ratio; and coating a further substrate with the second mixture; and forming a second pattern from the coating of the second mixture, wherein a second critical dimension of a feature of the second pattern meets a target critical dimension.

* * * * *